(12) United States Patent
Tanaka et al.

(10) Patent No.: US 7,781,147 B2
(45) Date of Patent: Aug. 24, 2010

(54) IMIDE-URETHANE RESIN, PHOTOSENSITIVE RESIN COMPOSITION INCLUDING THE SAME AND CURED PRODUCT

(75) Inventors: Ryutaro Tanaka, Kita-ku (JP); Toru Kurihashi, Kita-ku (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 62 days.

(21) Appl. No.: 12/083,029

(22) PCT Filed: Oct. 5, 2006

(86) PCT No.: PCT/JP2006/319930

§ 371 (c)(1),
(2), (4) Date: May 22, 2008

(87) PCT Pub. No.: WO2007/043425

PCT Pub. Date: Apr. 19, 2007

(65) Prior Publication Data

US 2008/0268373 A1    Oct. 30, 2008

(30) Foreign Application Priority Data

Oct. 7, 2005   (JP)   ............... 2005-294452

(51) Int. Cl.
| | |
|---|---|
| C08G 18/67 | (2006.01) |
| C08G 18/30 | (2006.01) |
| C08G 7/038 | (2006.01) |
| B32B 27/40 | (2006.01) |
| C08F 90/06 | (2006.01) |
| G03F 7/027 | (2006.01) |
| G03F 7/038 | (2006.01) |
| G03F 7/40 | (2006.01) |

(52) U.S. Cl. ............... 430/284.1; 528/60; 522/97; 522/90; 525/418; 525/419; 525/449

(58) Field of Classification Search ............... None
See application file for complete search history.

(56) References Cited

U.S. PATENT DOCUMENTS 3,622,525 A * 11/1971 Miller ............... 521/157
4,162,274 A * 7/1979 Rosenkranz ............... 528/75
2008/0311303 A1* 12/2008 Naiki et al. ............... 427/393.5

FOREIGN PATENT DOCUMENTS

| JP | 61-243869 | 10/1986 |
|---|---|---|
| JP | 2868190 | 12/1998 |
| JP | 2000-344889 | 12/2000 |
| JP | 2000-344890 | 12/2000 |
| JP | 2001-33959 | 2/2001 |
| JP | 2001-33960 | 2/2001 |
| JP | 2001-316436 | 11/2001 |
| JP | 2001-323036 | 11/2001 |
| JP | 2002-308960 | 10/2002 |
| JP | 2003-122001 A * | 4/2003 |
| JP | 2004-269895 | 9/2004 |

OTHER PUBLICATIONS

English translation of JP2003-122001 A (2003) from machine translation from AIPN Japan Patent Office National Center for Industrial Property Information and Training, generated Jun. 10, 2009, 20 pages.*
Derwent-ACC-No. 2003-735742, English abstract of JP 2003122001A, Koyanagi et al, Derwent Information LTD, from Derwent Week- 200370, 11 pages printed Jun. 10, 2009 from Derwent file of East database.*
AN 2003:31748, English Abstract of JP 2003122001 A, Tanaka et al, CAPLUS file fo ACS on STN entered on Apr. 25, 2003, 9 pages.*

* cited by examiner

*Primary Examiner*—Cynthia Hamilton
(74) *Attorney, Agent, or Firm*—Nields, Lemack & Frame, LLC

(57) ABSTRACT

[PROBLEMS] To provide a photosensitive resin composition which has excellent photosensitivity and gives a cured product reduced in warpage and excellent in flexing properties, adhesion, pencil hardness, solvent resistance, acid resistance, heat resistance, resistance to gold plating, etc.
[MEANS FOR SOLVING PROBLEMS] A urethane resin (A) soluble in aqueous alkali solutions and curable with active energy rays which is obtained by reacting a diisocyanate compound (a) with a tetrabasic acid dianhydride (b) to obtain a compound (E), reacting the compound (E) with a hydroxylated compound (c) having an unsaturated group and optionally with a hydroxylated compound (d) other than the compound (c) to obtain a compound (F), and further reacting hydroxy groups of the compound (F) with a diisocyanate compound (e).

12 Claims, No Drawings

IMIDE-URETHANE RESIN, PHOTOSENSITIVE RESIN COMPOSITION INCLUDING THE SAME AND CURED PRODUCT

TECHNICAL FIELD

The present invention relates to an imide-urethane resin which is developable in an alkaline aqueous solution and contains an unsaturated group, a photosensitive resin composition containing the imide-urethane resin, and its cured product which is useful for solder masks and cover lays for flexible printed wiring boards, interlayer insulation films for multilayer printed wiring boards and the like and is excellent in developability, flexibility, adhesiveness, heat resistance, chemical resistance, resistance to plating, and the like.

BACKGROUND ART

Photolithography is at present utilized for solder masks of some consumer printed wiring boards and almost all industrial printed wiring boards in view of high precision and high density. That is, it is a method using a photocurable resin composition which is exposed to active energy rays, subjected to a development treatment for image formation, and then further subjected to a finishing curing by heat and/or light irradiation. Besides, liquid solder masks of alkaline aqueous solution developing type using a diluted alkaline aqueous solution as a developing solution for development treatment predominate in consideration to environmental problems.

As such a solder mask of alkaline aqueous solution developing type, a solder mask composition composed of a photosensitive resin obtained by adding an acid anhydride to a reaction product of a novolac epoxy resin and an unsaturated monobasic acid, a photopolymerization initiator, a crosslinking agent and an epoxy resin, is disclosed in Patent Document 1.

However, the cured product of this solder mask composition is hard, and when it is applied to BGA (ball grid array) boards and flexible boards, whose usage is increasing in the fields of recent mobile devices, it causes trouble such as causing cracks on their surface and not following the bending of the boards.

As materials used for solder masks and cover lays applied to BGA boards and flexible boards, a composition using a compound obtained by reacting a reaction product of a polyfunctional bisphenol epoxy resin and a (meth)acrylic acid with a polybasic acid anhydride in view of flexibility, is described in Patent Document 2.

However, in the case where this material is used, although the crack resistance of the surface is improved, it has a problem in which the flexibility is still insufficient and the material cannot follow extreme bending.

Patent Document 3 and Patent Document 4 disclose, to further improve the flexibility, a photosensitive resin composition containing an unsaturated group-containing urethane resin obtained by reacting a hydroxyl group-containing unsaturated resin which is a reaction product of a diepoxide compound with 0.8 to 1.2 mol of an ethylenic unsaturated carboxylic acid having a number-average molecular weight of 72 to 1,000 and containing one average carboxyl group and one average ethylenic unsaturated group in one molecule to 1 mol of the epoxy group, a carboxyl group-containing diol compound, a diisocyanate compound, and optionally a polyol compound.

However, as for the resin design, raising the molecular weight causes increase in the acid value of the resin; raising the content of the ethylenic unsaturated group to enhance the sensitivity causes decrease in the acid value of the resin; thus, the molecular weight, sensitivity and developability are hardly balanced, and the composition has the problem with optimization as a solder mask composition.

Patent Document 5 and Patent Document 6 describe imide amide resins excellent in heat resistance.

However, these resins cannot be said to have the performance satisfying adhesiveness and flexibility.

Patent Document 1: Japanese Patent Laying Open (KOKAI) No. 61-243869

Patent Document 2: Japanese Patent No. 2868190

Patent Document 3: Japanese Patent Laying Open (KOKAI) No. 2001-33959

Patent Document 4: Japanese Patent Laying Open (KOKAI) No. 2001-33960

Patent Document 5: Japanese Patent Laying Open (KOKAI) No. 2000-344889

Patent Document 6: Japanese Patent Laying Open (KOKAI) No. 2000-344890

Printed wiring boards are demanded to have higher precision and higher density along with the reduced size and weight and the improved communication speed of mobile devices, so the demand for solder masks used therefor becomes increasingly high: concurrently having performances excellent in soldering heat resistance, resistance to electroless gold plating, adhesiveness to boards, chemical resistance and the like, while maintaining flexibility is demanded. However, there is at present no known composition fully satisfying these demands.

It is an object of the present invention to provide a photosensitive resin composition suitable for solder mask inks and cover layers, which is excellent in the photosensitivity to active energy rays so as to pattern fine images capable of meeting the high functionality of printed wiring boards, can form patterns by the development using a diluted alkaline aqueous solution, and provides a cured film, obtained by thermal curing in a post-cure process, having a sufficient flexibility, and excellent in the heat resistance, resistance to electroless gold plating, adhesiveness (to boards), chemical resistance and the like, and to provide its cured product.

DISCLOSURE OF INVENTION

As a result of exhaustive studies to solve the above-mentioned problems, the present inventors have found a novel active energy ray-curable alkaline aqueous solution-soluble urethane resin and a composition containing the urethane resin, and this has led to the completion of the present invention.

That is, the present invention relates to:

(1) An active energy ray-curable alkaline aqueous solution-soluble urethane resin (A) which is obtained by reacting a diisocyanate compound (a) with a tetrabasic acid dianhydride (b) to obtain a compound (E), reacting the compound (E) with a compound (c) having an unsaturated group and a hydroxyl group and, as an optional component, a compound (d) having a hydroxyl group other than the compound (c) to obtain a compound (F), and further reacting the hydroxyl group of the compound (F) with a diisocyanate compound (e);

(2) The active energy ray-curable alkaline aqueous solution-soluble urethane resin (A) according to the above (1), wherein the compound (c) having an unsaturated group and a hydroxyl group is an epoxy carboxylate compound which is a reaction product of an epoxy compound (g) having at least two epoxy groups in its molecule with a monocarboxylic acid compound (h) having an ethylenic unsaturated group in its molecule;

(3) The active energy ray-curable alkaline aqueous solution-soluble urethane resin (A) according to the above (1) or (2), wherein x<y is satisfied where x denotes the charging equivalent weight of the diisocyanate compound (a) and y denotes the charging equivalent weight of the tetrabasic acid dianhydride (b);

(4) The active energy ray-curable alkaline aqueous solution-soluble urethane resin (A) according to the above (1) or (2), wherein x'>y' is satisfied where x' denotes the charging equivalent weight of the diisocyanate compound (a) and y' denotes the charging equivalent weight of the tetrabasic acid dianhydride (b);

(5) An active energy ray-curable alkaline aqueous solution-soluble urethane resin (A') which is obtained by further reacting the urethane resin (A) according to any one of the above (1) to (4) with a dibasic acid monoanhydride (j) and/or a tribasic acid monoanhydride (f);

(6) The active energy ray-curable alkaline aqueous solution-soluble urethane resin according to any one of the above (1) to (5), wherein the urethane resin has a solid content acid value of 30 mg·KOH/g to 180 mg·KOH/g;

(7) A photosensitive resin composition comprising the active energy ray-curable alkaline aqueous solution-soluble urethane resin according to any one of the above (1) to (6);

(8) The photosensitive resin composition according to the above (7), further comprising a photopolymerization initiator (B), a reactive crosslinking agent (C), and as an optional component, a curing component (D);

(9) A cured product of the photosensitive resin composition according to the above (7) or (8);

(10) A cured product which is obtained by heating the cured product of the photosensitive resin composition according to the above (9) at 200 to 450° C.;

(11) A base material having a layer of the cured product according to the above (9) or (10); and

(12) An article having the base material according to the above (11).

The active energy ray-curable alkaline aqueous solution-soluble urethane resin of the present invention can provide a cured product having high heat resistance without using additives such as a filler and an epoxy resin and a curing agent; the photosensitive resin composition containing the urethane resin is excellent in photosensitivity in formation of a coating film by exposing and curing by active energy rays, and can be patterned by alkali development; and the cured product sufficiently satisfies characteristics such as flexibility, adhesiveness, pencil hardness, solvent resistance, acid resistance, resistance to gold plating and the like, particularly has very high heat resistance, and is suitable as a photosensitive resin composition for printed wiring boards and a photosensitive resin composition for cover lays.

BEST MODE FOR CARRYING OUT THE INVENTION

The active energy ray-curable alkaline aqueous solution-soluble urethane resin (A) of the present invention is obtained by reacting a diisocyanate compound (a) with a tetrabasic acid dianhydride (b) to obtain a compound (E), reacting the compound (E) with a compound (c) having an unsaturated group and a hydroxyl group and, as an optional component, a compound (d) having a hydroxyl group other than the compound (c) to obtain a compound (F), and further reacting the hydroxyl group of the compound (F) with a diisocyanate compound (e).

When the proportion of x and y is x<y where x denotes the charging equivalent weight of the diisocyanate compound (a) and y denoted the charging equivalent weight of the tetrabasic acid dianhydride (b), the resultant terminals are anhydrides and the reaction with the hydroxyl group of the compound (c) having an unsaturated group and a hydroxyl group, and the compound (d) as an optional component having a hydroxyl group other than the compound (c) is an esterification reaction. By contrast, when the proportion is x>y, the resultant terminals are isocyanate groups and the reaction with the hydroxyl group of the compound (c) having an unsaturated group and a hydroxyl group, and the compound (d) as an optional component having a hydroxyl group other than the compound (c) is an urethanization reaction. When the proportion is x=y, the molecular weight becomes very high, unpreferably causing gelation.

As the diisocyanate compound (a), any of diisocyanate compounds can be used as long as it has two isocyanate groups in its molecule, and a plurality of the diisocyanate compounds may be concurrently used. Above all, diisocyanate compounds especially excellent in flexibility and the like preferably include, for example, phenylene diisocyanate, tolylene diisocyanate, xylylene diisocyanate, tetramethylxylylene diisocyanate, diphenylmethane diisocyanate, naphthalene diisocyanate, tolidine diisocyanate, hexamethylene diisocyanate, dicyclohexylmethane diisocyanate, isophorone diisocyanate, allylene sulfone ether diisocyanate, allylcyanogen diisocyanate, N-acyl diisocyanate, trimethylhexamethylene diisocyanate, 1,3-bis(isocyanatemethyl)cyclohexane and norbornane-diisocyanatemethyl.

The tetrabasic acid dianhydride (b) is not especially limited, but includes, for example, such preferable compounds as pyromellitic dianhydride, ethylene glycol-bis(anhydrotrimellitate), glycerol-bis(anhydrotrimellitate) monoacetate, 1,2,3,4-butanetetracarboxylic dianhydride, 3,3',4,4'-diphenylsulfone tetracarboxylic dianhydride, 3,3',4,4'-benzophenonetetracarboxylic dianhydride, 3,3',4,4'-biphenyltetracarboxylic dianhydride, 3,3',4,4'-diphenyl ether tetracarboxylic dianhydride, 2,2-bis(3,4-anhydrodicarboxyphenyl)propane, 2,2-bis(3,4-anhydrodicarboxyphenyl)hexafluoropropane, 5-(2,5-dioxotetrahydro-3-furanyl)-3-methylcyclohexene-1,2-dicarboxylic anhydride, and 3a, 4,5,9b-tetrahydro-5-(tetrahydro-2,5-dioxo-3-furanyl)-naphtho[1,2-c]furan-1,3-dione.

The reaction of the diisocyanate compound (a) and the tetrabasic acid dianhydride (b) can be performed solventlessly or in a single solvent such as an organic solvent or a reactive crosslinking agent (C) described later or in a mixed solution thereof. The reaction temperature in the case is 30 to 150° C., and preferably 40 to 120° C.; and the reaction time thereof is 2 to 24 hours, and preferably 5 to 18 hours.

A resin obtained by this reaction has an isoimide structure and/or an imide structure.

The organic solvent includes, for example, amides such as N-methyl pyrrolidone and dimethylacetamide; ketones such as acetone, ethyl methyl ketone and cyclohexanone; aromatic hydrocarbons such as benzene, toluene, xylene and tetramethylbenzene; glycol ethers such as ethylene glycol dimethyl ether, ethylene glycol diethyl ether, dipropylene glycol dimethyl ether, dipropylene glycol diethyl ether, triethylene glycol dimethyl ether and triethylene glycol diethyl ether; esters such as ethyl acetate, butyl acetate, methylcellosolve acetate, ethylcellosolve acetate, butylcellosolve acetate, carbitol acetate, propylene glycol monomethyl ether acetate, dialkyl glutarates (e.g. dimethyl glutarate), dialkyl succinates (e.g. dimethyl succinate) and dialkyl adipates (e.g. dimethyl adipate); cyclic esters such as γ-butyrolactone; and petroleum solvents such as petroleum ethers, petroleum naphthas, hydrogenated petroleum naphthas and solvent naphthas.

The reaction may be performed with no catalyst, but may use a catalyst to promote the reaction. The amount of the catalyst used in the case is not more than 10% by weight to the reactants. The catalyst includes, for example, dimethylaminopyridine, triethylamine, benzyldimethylamine, triethylammonium chloride, benzyltrimethylammonium bromide, benzyltrimethylammonium iodide, triphenylphosphine, triphenylstibine, chromium 2-ethylhexanoate, chromium octanoate, zinc 2-ethylhexanoate, zinc octanoate, zirconium octanoate, dimethyl sulfide and diphenyl sulfide.

Further, for this reaction, a heat polymerization inhibitor such as hydroquinone, 2-methylhydroquinone, hydroquinone monomethyl ether or 2,6-di-tert-butyl-p-cresol may be used.

The confirmation of the reaction progress can be made, if necessary, by sampling the reaction product and measuring the absorption at about 2270 $cm^{-1}$ in infrared absorption spectrum and the isocyanate value.

In the present invention, the "isocyanate value" means the same as commonly used, and refers to a mass of a compound per equivalent weight of an isocyanate group.

The compound (c) having an unsaturated group and a hydroxyl group used for manufacture of the active energy ray-curable alkaline aqueous solution-soluble urethane resin (A) of the present invention is not especially limited as long as it has an unsaturated group such as a double bond and a hydroxyl group in its molecule. However, especially to improve the crosslinking density of the active energy ray-curable alkaline aqueous solution-soluble urethane resin and improve the heat resistance of a composition containing the urethane resin, the compound (c) is preferably an epoxy carboxylate compound which is a reaction product of an epoxy compound (g) having at least two epoxy groups in its molecule and a monocarboxylic acid compound (h) having an ethylenic unsaturated group in its molecule.

The epoxy compound (g) is preferably a compound having two glycidyl groups in its molecule, and includes, for example, phenyl diglycidyl ethers such as hydroquinone diglycidyl ether, catechol diglycidyl ether and resorcinol diglycidyl ether; bisphenol diepoxy compounds such as bisphenol A epoxy resins, bisphenol F epoxy resins, bisphenol S epoxy resins and epoxy resins of 2,2-bis(4-hydroxyphenyl)-1,1,1,3,3,3-hexafluoropropane; hydrogenated bisphenol diepoxy compounds such as hydrogenated bisphenol A epoxy resins, hydrogenated bisphenol F epoxy resins, hydrogenated bisphenol S epoxy resins and epoxy resins of hydrogenated 2,2-bis(4-hydroxyphenyl)-1,1,1,3,3,3-hexafluoropropane; halogenated bisphenol diepoxy compounds such as brominated bisphenol A epoxy resins and brominated bisphenol F epoxy resins; alicyclic diepoxy compounds such as cyclohexanedimethanol diglycidyl ether compounds; aliphatic diglycidyl ether compounds such as 1,6-hexanediol diglycidyl ether, 1,4-butanediol diglycidyl ether and diethylene glycol diglycidyl ether; polysulfide diglycidyl ether compounds such as polysulfide diglycidyl ethers; and biphenol diepoxy compounds such as bixylenol epoxy resins.

The commercially available products of the epoxy compound (g) include, for example, bisphenol A epoxy resins such as Epikote 828, Epikote 1001, Epikote 1002, Epikote 1003 and Epikote 1004 (made by Japan Epoxy Resins Co., Ltd.), Epomic R-140, Epomic R-301 and Epomic R-304 (made by Mitsui Chemicals Inc.), DER-331, DER-332 and DER-324 (made by Dow Chemical Co.), Epiclon 840 and Epiclon 850 (made by Dainippon Ink and Chemicals, Inc.), UVR-6410 (made by Union Carbide Chemical & Plastics Technology Corp.), and YD-8125 (made by Tohto Kasei Co., Ltd.); bisphenol F epoxy resins such as UVR-6490 (made by Union Carbide Chemical & Plastics Technology Corp.), YDF-2001, YDF-2004 and YDF-8170 (made by Tohto Kasei Co., Ltd.), and Epiclon 830 and Epiclon 835 (made by Dainippon Ink and Chemicals, Inc.); hydrogenated bisphenol A epoxy resins such as HBPA-DGE (made by Maruzen Petrochemical Co., Ltd.), and Rikaresin HBE-100 (made by New Japan Chemical Co., Ltd.); brominated bisphenol A epoxy resins such as DER-513, DER-514 and DER-542 (made by Dow Chemical Co.); alicyclic diepoxy compounds such as Celoxide 2021 (made by Daicel Chemical Industries, Ltd.), Rikaresin DME-100 (made by New Japan Chemical Co., Ltd.), and EX-216 (made by Nagase ChemteX Corp.); aliphatic diglycidyl ether compounds such as ED-503 (made by Adeka Corp.), Rikaresin W-100 (made by New Japan Chemical Co., Ltd.), and EX-212, EX-214 and EX-850 (made by Nagase ChemteX Corp.); polysulfide diglycidyl ether compounds such as FLEP-50 and FLEP-60 (made by Toray Finechemicals Co., Ltd.); and biphenol diepoxy compounds such as YX4000 (made by Japan Epoxy Resins Co., Ltd.).

The monocarboxylic acid compound (h) having an ethylenic unsaturated group in its molecule is preferably, for example, (meth)acrylic acid or cinnamic acid because a composition including the monocarboxylic acid compound (h) has an enhanced photosensitivity.

The reaction of the epoxy compound (g) having at least two epoxy groups in its molecule with the monocarboxylic acid compound (h) having an ethylenic unsaturated group in its molecule can be performed solventlessly, or in an organic solvent, a later-described reactive crosslinking agent (C) or the like alone or in a mixed solution thereof.

The organic solvent includes solvents similar to those usable in the reaction of the diisocyanate compound (a) and the tetrabasic acid dianhydride (b).

The charging proportion of raw materials in the reaction is preferably about 0.8 to 1.2 equivalent weights of the monocarboxylic acid compound (h) having an ethylenic unsaturated group in its molecule to one equivalent weight of epoxy group of the epoxy compound (g) having at least two epoxy groups in its molecule. In the case where the proportion is out of this range, gelation is liable to occur during the reaction and the thermal stability of an obtained alkaline aqueous solution-soluble urethane resin is liable to decrease.

In this reaction, a heat polymerization inhibitor is preferably added to suppress heat polymerization reaction. In the case where an inhibitor is added, the addition amount is about 0.05 to 10% by weight to the reaction product, preferably about 0.1 to 5% by weight. The heat polymerization inhibitor includes compounds similar to those usable in the reaction of the diisocyanate compound (a) and the tetrabasic acid dianhydride (b).

Further, in this reaction, a catalyst for promoting the reaction is preferably used, and in the case where a catalyst is used, the using amount is about 0.1 to 10% by weight to the reaction product, preferably about 0.2 to 5% by weight. The catalyst includes compounds similar to those usable in the reaction of the diisocyanate compound (a) and the tetrabasic acid dianhydride (b).

The reaction temperature in the case is 60 to 150° C., and preferably 80 to 130° C.; and the reaction time is 3 to 60 hours, and preferably 5 to 40 hours.

The reaction of the compound (E) which is a reaction product of the diisocyanate compound (a) with the tetrabasic acid dianhydride (b), with the compound (c) having an unsaturated group and a hydroxyl group and optionally with a compound (d) having a hydroxyl group other than the compound (c) may be performed with no catalyst, but may use a catalyst similar to the above to promote the reaction, and the amount of the catalyst used in the case is not more than 10% by weight to the reaction product. The reaction temperature at the case is 40 to 120° C.; and the reaction time is preferably 2 to 50 hours.

The compound (d) having a hydroxyl group other than the compound (c) is preferably an aliphatic or alicyclic compound in which two hydroxyl groups are bonded to two different carbon atoms, and includes, for example, diol compounds such as ethylene glycol, propylene glycol, trimethylene glycol, 1,4-butanediol, 1,5-pentanediol, 1,6-hexandiol, 1,7-heptane diol, 1,8-octanediol, 1,9-nonanediol, 1,10-decanediol, hydrobenzoin, benzpinacol, cyclopentane-1,2-diol, cyclohexane-1,2-diol, cyclohexane-1,4-diol, cyclohexane-1,2-dimethanol, cyclohexane-1,4-dimethanol, dimethylol propionic acid, dimethylol butanoic acid, butadiene-acrylonitrile copolymers having a hydroxyl group at their terminals, spiroglycols having a hydroxyl group at their terminals, dioxane glycols having a hydroxyl group at their terminals, tricyclodecane dimethanols having a hydroxyl group at their terminals, macro-monomers having a hydroxyl group at their terminals and polystyrenes in their side chains, and macro-monomers having a hydroxyl group at their terminals and polystyrene-acrylonitrile copolymers in their side chains; and reaction products of such diol compounds with an oxide such as ethylene oxide and propylene oxide.

In the present invention, in the case where the compounds have optical isomers, regioisomers or stereoisomers, the any isomeric compounds are included in the present invention.

Since the compound (F) thus obtained has a hydroxyl group or groups, it causes the urethanization reaction with the diisocyanate compound (e) to provide the urethane resin (A).

The diisocyanate compound (e) includes compounds similar to the diisocyanate compound (a), and preferable compounds are the same.

The charging proportion of the diisocyanate compound (e) is preferably in the range of 1 to 0.5 based on 1 of the compound (F). This reaction can be performed with no catalyst, but a catalyst similar to the above may be used to promote the reaction, and the amount of the catalyst used in the case is not more than 10% by weight to the reaction product. The reaction temperature in the case is 40 to 120° C.; and the reaction time is preferably 2 to 50 hours.

Further, the obtained isoimide-urethane resin (A) is reacted with a dibasic acid monoanhydride (j) and/or a tribasic acid monoanhydride (f) to obtain an active energy ray-curable alkaline aqueous solution-soluble urethane resin (A'), and the acid value of the urethane resin (A') can be controlled. The acid anhydride is not especially limited, but is preferably, for example, succinic anhydride, phthalic anhydride, tetrahydrophthalic anhydride, hexahydrophthalic anhydride, itaconic anhydride, 3-methyltetrahydrophthalic anhydride, 4-methylhexahydrophthalic anhydride, trimellitic anhydride or maleic anhydride in view of alkaline aqueous solution developability, heat resistance, hydrolysis resistance and the like.

The reaction of the urethane resin (A) with the dibasic acid monoanhydride (j) and/or the tribasic acid monoanhydride (f) may be performed solventlessly or in a solvent similar to that usable in the reaction of the diisocyanate compound (a) and the tetrabasic acid dianhydride (b). The reaction temperature in the case is 60 to 150° C., and preferably 80 to 130° C.; and the reaction time is 3 to 60 hours, and preferably 5 to 40 hours. A catalyst similar to that in the above reaction to promote the reaction may be used, and the amount of the catalyst used in the case is not more than 10% by weight to the reaction product. At this time, the aforementioned heat polymerization inhibitor may be used.

The ethylenic unsaturated group equivalent weight of the active energy ray-curable alkaline aqueous solution-soluble urethane resin (A) or (A') of the present invention is preferably 300 to 2,000 g/eq.wt., and more preferably 350 to 800 g/eq.wt. With the equivalent weight of less than 300 g/eq.wt., too high a crosslinking density results in no flexibility, and in the worst case, when the urethane resin is turned into a cured product, cracks occur in the urethane resin and the cured product separates from a board in some cases. By contrast, with the equivalent weight exceeding 2,000 g/eq.wt., the photosensitivity becomes too low in some cases, which is unpreferable.

Here, the "ethylenic unsaturated group equivalent weight" in the present invention has the same meaning as commonly used, and refers to the mass of a compound per ethylenic unsaturated group equivalent weight, expressed in the unit of g/eq.wt.

The charging amounts of the tetrabasic acid dianhydride (b) and the dibasic acid monoanhydride (j) and/or the tribasic acid monoanhydride (f) are preferably such calculated values that the solid content acid value of the active energy ray-curable alkaline aqueous solution-soluble urethane resin (A) or (A') of the present invention is 30 to 150 mg·KOH/g. With the solid content acid value of less than 30 mg·KOH/g, the solubility to an alkaline aqueous solution is insufficient; and residues are left in patterning and in the case of the worst, patterning cannot be made. By contrast, with the solid content acid value exceeding 150 mg·KOH/g, the solubility to an alkaline aqueous solution becomes too high, unpreferably causing exfoliation of the photocured pattern in some cases. In the present invention, the "solid content acid value" refers to the amount (mg) of potassium hydroxide necessary to neutralize the acidity of carboxylic acid in 1 g of the resin. Moreover, in the present invention, the "acid value" refers to the amount (mg) of potassium hydroxide necessary to neutralize 1 g of a solution containing the resin. These are measured by an ordinary neutralizing titration according to JIS K0070. If the concentration of the resin in a solution is known, the solid content acid value can also be determined through calculation from the acid value of the solution.

When the charging amount of the diisocyanate compound (a) is set to 1, the tetrabasic acid dianhydride (b) is preferably in the range of 0.01 to 0.99 or 1.01 to 5. With this value of less than 0.01, the molecular weight decreases, unpreferably causing decreases in flexibility, photosensitivity, adhesiveness and the like in some cases. With the value of 0.99 to 1.01, the molecular weight of the active energy ray-curable alkaline aqueous solution-soluble isoimide-urethane resin (A)

becomes high, causing the gelation and reducing the developability in some cases. With the value exceeding 5, the molecular weight decreases, unpreferably causing decreases in flexibility, photosensitivity, adhesiveness and the like in some cases.

The active energy ray-curable alkaline aqueous solution-soluble urethane resin (A) or (A') thus obtained of the present invention, when a solvent is used, can be provided as a solid by removing the solvent by a suitable method, but when the urethane resin (A) or (A') is used as a photosensitive resin composition, it may be used without removing the solvent.

The active energy ray-curable alkaline aqueous solution-soluble isoimide-urethane resin of the present invention is soluble in an alkaline aqueous solution, but is also soluble in the above-mentioned solvents, so when the resin is used for solder resist, plating resist and the like, the resin can also be developed with any of the solvents.

The photosensitive resin composition of the present invention contains an above-mentioned active energy ray-curable alkaline aqueous solution-soluble urethane resin (A) or (A'), a photopolymerization initiator (B), a reactive crosslinking agent (C) and as an optional component, a curing component (D).

The content proportion of the above-mentioned active energy ray-curable alkaline aqueous solution-soluble urethane resin (A) or (A') contained in the photosensitive resin composition of the present invention is generally 15 to 70% by weight based on 100% by weight of the solid content of the photosensitive resin composition, and preferably 20 to 60% by weight.

The photopolymerization initiator (B) contained in the photosensitive resin composition of the present invention includes, for example, benzoins such as benzoin, benzoin methyl ether, benzoin ethyl ether, benzoin propyl ether and benzoin isobutyl ether; acetophenones such as acetophenone, 2,2-diethoxy-2-phenylacetophenone, 1,1-dichloroacetophenone, 2-hydroxy-2-methyl-phenylpropan-1-one, diethoxyacetophenone, 1-hydroxy-cyclo-hexyl phenyl ketone and 2-methyl-1-[4-(methylthio)phenyl]-2-morpholinopropan-1-one; anthraquinones such as 2-ethylanthraquinone, 2-tert-butylanthraquinone, 2-chloroanthraquinone and 2-amylanthraquinone; thioxanthones such as 2,4-diethylthioxanthone, 2-isopropylthioxanthone and 2-chlorothioxanthone; ketals such as acetophenone dimethyl ketal and benzyl dimethyl ketal; benzophenones such as benzophenone, 4-benzoyl-4'-methyldiphenyl sulfide and 4,4'-bismethylaminobenzophenone; and phosphine oxides such as 2,4,6-trimethylbenzoyldiphenylphosphine oxide and bis(2,4,6-trimethylbenzoyl)phenylphosphine oxide. The addition proportion of these is generally 1 to 30% by weight based on 100% by weight of the solid content of the photosensitive resin composition, and preferably 2 to 25% by weight.

These may be used singly or as a mixture of two or more, and may be further used in combination with a reaction promoter and the like such as tertiary amines including triethanolamine and methyldiethanolamine, and benzoic acid derivatiyes including N,N-dimethylaminobenzoic acid ethyl ester and N,N-dimethylaminobenzoic acid isoamyl ester. The addition amount of these reaction promoters is preferably not more than 100% by weight to the photopolymerization initiator (B).

The reactive crosslinking agent (C) contained in the photosensitive resin composition of the present invention includes, for example, 2-hydroxyethyl (meth)acrylate, 2-hydroxypropyl (meth)acrylate, 1,4-butanediol mono(meth)acrylate, carbitol (meth)acrylate, acryloylmorpholine, half esters being reaction products of a hydroxyl group-containing (meth)acrylate (e.g., 2-hydroxyethyl (meth)acrylate, 2-hydroxypropyl (meth)acrylate and 1,4-butanediol mono(meth)acrylate) with an acid anhydride of a polycarboxylic acid compound (e.g., succinic anhydride, maleic anhydride, phthalic anhydride, tetrahydrophthalic anhydride and hexahydrophthalic anhydride), polyethylene glycol di(meth)acrylates, tripropylene glycol di(meth)acrylates, trimethylolpropane tri(meth)acrylate, trimethylolpropane polyethoxy tri(meth)acrylates, glycerol polypropoxy tri(meth)acrylates, di(meth)acrylates of an ε-caprolactone adduct of a neopentylglycol hydroxypivalate (e.g., KAYARAD HX-220 and HX-620, made by Nippon Kayaku Co., Ltd.), pentaerythritol tetra(meth)acrylate, poly(meth)acrylates of reaction products of dipentaerythritol and ε-caprolactone, dipentaerythritol poly(meth)acrylates, and epoxy (meth)acrylates being reaction products of a mono- or poly-glycidyl compound (e.g., butyl glycidyl ether, phenyl glycidyl ether, polyethylene glycol diglycidyl ethers, polypropylene glycol diglycidyl ethers, 1,6-hexanediol diglycidyl ether, diglycidyl hexahydrophthalate, glycerol polyglycidyl ethers, glycerol polyethoxy glycidyl ethers, trimethylolpropane polyglycidyl ethers and trimethylolpropane polyethoxy polyglycidyl ethers) with a (meth)acrylate. The addition amount of these is generally 2 to 40% by weight based on 100% by weight of the solid content of the photosensitive resin composition, and preferably 5 to 30% by weight.

The curing component (D) as an optional component contained in the photosensitive resin composition of the present invention includes, for example, epoxy compounds and oxazine compounds. The curing component (D) is most preferably used in the case where it reacts by heating with a carboxyl group remaining in a resin coating film after photocuring to provide a cured coating film having a further high chemical resistance.

The epoxy compounds as the curing component (D) include, for example, phenol novolac epoxy resins, cresol novolac epoxy resins, trishydroxyphenylmethane epoxy resins, dicyclopentadiene phenol epoxy resins, bisphenol A epoxy resins, bisphenol F epoxy resins, biphenol epoxy resins, bisphenol A novolac epoxy resins, naphthalene skeleton-containing epoxy resins, cycloaliphatic epoxy resins, heterocyclic epoxy resins and glyoxal epoxy resins.

The phenol novolac epoxy resin includes, for example, Epiclon N-770 (made by Dainippon Ink & Chemicals), D.E.N438 (made by Dow Chemical Co.), Epikote 154 (made by Japan Epoxy Resins Co., Ltd.) and RE-306 (made by Nippon Kayaku Co., Ltd.).

The cresol novolac epoxy resin includes, for example, Epiclon N-695 (made by Dainippon Ink & Chemicals), EOCN-102S, EOCN-103S and EOCN-104S (made by Nippon Kayaku Co., Ltd.), UVR-6650 (made by Union Carbide Chemical & Plastics Technology Corp.) and ESCN-195 (made by Sumitomo Chemical Co., Ltd.).

The trishydroxyphenylmethane epoxy resin includes, for example, EPPN-503, EPPN-502H and EPPN-501H (made by Nippon Kayaku Co., Ltd.), TACTIX-742 (made by Dow Chemical Co.), and Epikote E1032H60 (made by Japan Epoxy Resins Co., Ltd.).

The dicyclopentadiene phenol epoxy resin includes, for example, Epiclon EXA-7200 (made by Dainippon Ink & Chemicals), and TACTIX-556 (made by Dow Chemical Co.).

The bisphenol epoxy resin includes, for example, bisphenol A epoxy resins such as Epikote 828 and Epikote 1001 (made by Japan Epoxy Resins Co., Ltd.), UVR-6410 (made by Union Carbide Chemical & Plastics Technology Corp.), D.E.R.-331 (made by Dow Chemical Co.) and YD-8125 (made by Tohto Kasei Co., Ltd.), and bisphenol F epoxy resins such as UVR-6490 (made by Union Carbide Chemical & Plastics Technology Corp.), YDF-8170 (made by Tohto Kasei Co., Ltd.), and LCE-21 (made by Nippon Kayaku Co., Ltd.).

The biphenol epoxy resin includes, for example, biphenol epoxy resins such as NC-3000 and NC-3000H (made by Nippon Kayaku Co., Ltd.), bixylenol epoxy resins such as YX-4000 (made by Japan Epoxy Resins Co., Ltd.), and YL-6121 (made by Japan Epoxy Resins Co., Ltd.).

The bisphenol A novolak epoxy resin includes, for example, Epiclon N-880 (made by Dainippon Ink & Chemicals), and Epikote E157S75 (made by Japan Epoxy Resins Co., Ltd.).

The naphthalene skeleton-containing epoxy resin includes, for example, NC-7000 (made by Nippon Kayaku Co., Ltd.), and EXA-4750 (made by Dainippon Ink & Chemicals).

The cycloaliphatic epoxy resin includes, for example, EHPE-3150 (made by Daicel Chemical Industries, Ltd.).

The heterocyclic epoxy resin includes, for example, TEPIC (made by Nissan Chemical Industries).

The glyoxal epoxy resin includes, for example, GTR-1800 (made by Nippon Kayaku Co., Ltd.).

The oxazine compound as the curing component (D) includes, for example, B-m type benzoxazine, P-a type benzoxazine, and B-a type benzoxazine (made by Shikoku Chemicals Corp.).

In the case where the curing component (D) is added, the addition proportion is preferably an amount of not more than 200% of the equivalent weight calculated from the solid content acid value and using amount of the active energy ray-curable alkaline aqueous solution-soluble urethane resin (A) or (A').

With the amount exceeding 200%, the developability of the photosensitive resin composition of the present invention unpreferably remarkably decreases in some cases.

Further, various types of additives, such as fillers including talc, barium sulfate, calcium carbonate, magnesium carbonate, barium titanate, aluminium hydroxide, aluminium oxide, silica and clay, thixotropy promoting agents including Aerosil, colorants including phthalocyanine blue, phthalocyanine green and titanium oxide, leveling agents and defoaming agents including silicone-based and fluorine-based ones, and polymerization inhibitors including hydroquinone and hydroquinone monomethyl ether, can be optionally added for the purpose of enhancing various properties of the composition.

In the case where the above curing component (D) is contained in the photosensitive resin composition, the curing component (D) may be previously mixed in a resin composition, but may be mixed and used before application to a printed wiring board. That is, a base solution in which the above-mentioned isoimide-urethane resin (A) or (A') component as a main component and optionally an epoxy curing promoter (thermal curing catalyst) such as melamine or an imidazole-based one and the like are formulated and a curing agent solution in which the curing component (D) as a main component is formulated are formulated as a two-solution type, and these may be mixed in use.

The photosensitive resin composition of the present invention can also be used as a dry film resist having a structure in which the resin composition is sandwiched between a supporting film and a protecting film.

The photosensitive resin composition (liquid or film-shaped) of the present invention is useful for interlayer insulation materials of electronic components, optical waveguides to connect optical components, resist materials of solder resists and cover lays and the like for printed wiring boards, and can also be used as color filters, printing inks, sealants, paints, coating agents, adhesives and the like.

The active energy rays in the present invention include ultraviolet rays, visible rays, infrared rays, electron beams and radiation rays. To cure the urethane resin (A) or (A'), ultraviolet rays or electron beams are preferable in consideration of applications. Curing of the resin composition of the present invention can be performed by a common method using irradiation with active energy rays such as ultraviolet rays. For example, to irradiate ultraviolet rays, an ultraviolet ray generator, such as a low pressure mercury lamp, a high pressure mercury lamp, an ultrahigh pressure mercury lamp, a xenon lamp, or an ultraviolet radiation laser (excimer laser, etc.), may be used.

A cured product of the resin composition of the present invention is used, for example, for electric and electronic components such as resist films and interlayer insulation materials for a build-up process, and these base materials are included in the present invention. Articles having these base materials, for example, computers, household electric appliances and mobile devices, are included in the present invention.

The layer of the cured product of the resin composition of the present invention has a film thickness of about 0.5 to 160 μm, and preferably about 1 to 100 μm.

The printed wiring board of the present invention can be obtained, for example, as follows. That is, when a liquid resin composition is used, the composition of the present invention is applied to form a coating having a thickness of 5 to 160 μm on a board for printed wiring by a method such as screen printing, spraying, roll coating, electrostatic coating or curtain coating, and the coated film is dried generally at a temperature of 50 to 110° C., preferably 60 to 100° C. Then, active energy rays such as ultraviolet rays are irradiated generally at an intensity of about 10 to 2,000 mJ/cm$^2$ directly or indirectly on the dried coated film through a photomask in which an exposure pattern such as a negative film is formed; and unexposed parts are developed using a later described developing solution, for example, by spraying, shaking immersion, brushing, scrubbing or the like. Then, ultraviolet rays are further optionally irradiated, and when a curing component (D) is used, the heating treatment is performed generally at a temperature of 100 to 200° C., preferably at a temperature of 140 to 180° C. The cured product can provide a printed wiring board having a permanent protecting film excellent in resistance to gold plating and various characteristics such as heat resistance, solvent resistance, acid resistance, adhesiveness and flexibility. In the case where the cured product has the isoimide structure left, as required, it may be effectively imidized by heating at 200 to 450° C., preferably at 250 to 380° C. Simultaneous imidization is possible by the heating treatment in the case where a curing component (D) is used.

In the above-mentioned development, an inorganic alkali aqueous solution such as potassium hydroxide, sodium hydroxide, sodium carbonate, potassium carbonate, sodium hydrogen carbonate, potassium hydrogen carbonate, sodium phosphate or potassium phosphate, or an organic alkali aqueous solution such as tetramethylammonium hydroxide, tetraethylammonium hydroxide, tetrabutylammonium hydroxide, monoethanolamine, diethanolamine or triethanolamine can be used.

EXAMPLES

Hereinafter, the present invention will be described further specifically by way of examples, but the scope of the present invention is not limited to the following examples.

Synthesis Example 1

Synthesis of Compound (c) Having Unsaturated Group and Hydroxyl Group

A 1-L flask with a stirring device and a refluxing tube was charged with 368.0 g of RE310S, made by Nippon Kayaku Co., Ltd., (a two-functional bisphenol A epoxy resin, epoxy equivalent weight: 184 g/eq.wt.) as an epoxy compound (g) having at least two epoxy groups in its molecule, 144.12 g of acrylic acid (molecular weight: 72.06) as a monocarboxylic acid compound (h) having an ethylenic unsaturated group in its molecule, 1.54 g of 2,6-di-tert-butyl-p-cresol as a heat polymerization inhibitor, and 1.54 g of triphenylphosphine as a reaction catalyst. The reactant solution was reacted at a temperature of 98° C. till the acid value of the reactant solution became not more than 0.5 mg·KOH/g. An epoxy carboxylate compound (c-1) (its theoretical molecular weight: 512.12) was thus obtained.

Synthesis Example 2

Synthesis of Compound (c) Having Together Unsaturated Group and Hydroxyl Group A 1-L flask with a stirring device and a refluxing tube was charged with 334.0 g of YDF-170, made by Tohto Kasei Co., Ltd., (a two-functional bisphenol F epoxy resin, epoxy equivalent weight: 167 g/eq.wt.) as an epoxy compound (g) having at least two epoxy groups in its molecule, 172.18 g of methacrylic acid (molecular weight: 86.09) as a monocarboxylic acid compound (h) having an ethylenic unsaturated group in its molecule, 1.52 g of 2,6-di-tert-butyl-p-cresol as a heat polymerization inhibitor, and 1.52 g of triphenylphosphine as a reaction catalyst. The reactant solution was reacted at a temperature of 98° C. till the acid value of the reactant solution became not more than 0.5 mg·KOH/g. An epoxy carboxylate compound (c-2) (its theoretical molecular weight: 506.18) was thus obtained.

Example 1

A 1-L flask with a stirring device and a refluxing tube was charged with 37.41 g of pyromellitic anhydride (its molecular weight: 218.12) as a tetrabasic acid dianhydride (b), and 40.96 g of N-methylpyrrolidone as a solvent for reaction; and 24.04 g of trimethylhexamethylene diisocyanate (its molecular weight: 210.27) as a diisocyanate compound (a) was added thereto at 40° C. under stirring. Thereafter, the temperature of the mixture was raised to 95° C. and the mixture was reacted for 15 hours till the absorption at about 2270 cm$^{-1}$ by infrared absorption spectroscopy vanished. Then, 58.55 g of the epoxy carboxylate compound (c-1) (its theoretical molecular weight: 512.12) synthesized in Synthesis Example 1 and serving as a compound (c) having an unsaturated group and a hydroxyl group, and 39.03 g of N-methylpyrrolidone as a solvent for reaction were put into the resultant solution, and the reaction system was reacted at 98° C. for 10 hours. Then, 12.70 g of isophorone diisocyanate (its molecular weight: 222.28) as a diisocyanate compound (e), and 8.47 g of N-methylpyrrolidone as a solvent for reaction were added to the resultant solution; thereafter, the temperature of the resultant solution was raised to 80° C. and the solution was reacted till for 15 hours till the absorption at about 2270 cm$^{-1}$ by infrared absorption spectroscopy vanished. A resin solution containing 60% by weight of an active energy ray-curable alkaline aqueous solution-soluble urethane resin (A) was thus obtained. (This solution was referred to as R-1.) Measurement of the acid value gave 43.5 mg·KOH/g (its solid content acid value: 72.5 mg·KOH/g).

Example 2

A 3-L flask with a stirring device and a refluxing tube was charged with 294.22 g of 3,3',4,4'-biphenyltetracarboxylic dianhydride (its molecular weight: 294.22) as a tetrabasic acid dianhydride (b), and 418.43 g of N-methylpyrrolidone as a solvent for reaction; and 333.42 g of isophorone diisocyanate (a) (its molecular weight: 222.28) was added thereto at 40° C. under stirring. Thereafter, the temperature of the mixture was raised to 60° C. and the mixture was reacted for 25 hours till the absorption at about 2270 cm$^{-1}$ by infrared absorption spectroscopy vanished. Then, 506.18 g of the epoxy carboxylate compound (c-2) (its theoretical molecular weight: 506.18) synthesized in Synthesis Example 2 and serving as a compound (c) having an unsaturated group and a hydroxyl group, and 337.46 g of N-methylpyrrolidone as a solvent for reaction were put into the resultant solution, and the reaction system was reacted at 98° C. for 10 hours. Then, 111.14 g of isophorone diisocyanate (its molecular weight: 222.28) as a diisocyanate compound (e), and 74.09 g of N-methylpyrrolidone as a solvent for reaction were added to the resultant solution; thereafter, the temperature of the resultant solution was raised to 80° C. and the solution was reacted for 15 hours till the absorption at about 2270 cm$^{-1}$ by infrared absorption spectroscopy vanished. A resin solution containing 60% by weight of an active energy ray-curable alkaline aqueous solution-soluble urethane resin (A) was thus obtained. (This solution was referred to as R-2.) Measurement of the acid value gave 54.1 mg·KOH/g (its solid content acid value: 90.1 mg·KOH/g).

Example 3

A 1-L flask with a stirring device and a refluxing tube was charged with 37.41 g of pyromellitic anhydride (its molecular weight: 218.12) as a tetrabasic acid dianhydride (b), and 40.96 g of N-methylpyrrolidone as a solvent for reaction; and 24.04 g of trimethylhexamethylene diisocyanate (its molecular weight: 210.27) as a diisocyanate compound (a) was added thereto at 40° C. under stirring. Thereafter, the temperature of the mixture was raised to 95° C. and the mixture was reacted for 15 hours till the absorption at about 2270 cm$^{-1}$ by infrared absorption spectroscopy vanished. Then, 58.55 g of the epoxy carboxylate compound (c-1) (its theoretical molecular weight: 512.12) synthesized in Synthesis Example 1 and serving as a compound (c) having an unsaturated group and a hydroxyl group, and 39.03 g of N-methylpyrrolidone as a solvent for reaction were put into the resultant solution, and the reaction system was reacted at 98° C. for 10 hours. Then, 12.70 g of isophorone diisocyanate (its molecular weight: 222.28) as a diisocyanate compound (e), and 8.47 g of N-methylpyrrolidone as a solvent for reaction were added to the resultant solution; thereafter, the temperature of the resultant solution was raised to 80° C. and the solution was reacted for 15 hours till the absorption at about 2270 cm$^{-1}$ by infrared absorption spectroscopy vanished. Then, 7.94 g of succinic anhydride (its theoretical molecular weight: 100.07) as a dibasic acid monoanhydride (j), and 5.29 g of N-methylpyrrolidone as a solvent for reaction were added to the resultant solution, and the reaction system was reacted at 98° C. for 5 hours to obtain a resin solution containing 60% by weight of an active energy ray-curable alkaline aqueous solution-soluble urethane resin (A'). (This solution was referred to as R-3.) Measurement of the acid value gave 60.03 mg·KOH/g (its solid content acid value: 100.05 mg·KOH/g).

Comparative Example 1

A 3-L flask with a stirring device and a refluxing tube was charged with 860.0 g of EOCN-103S, made by Nippon Kayaku Co., Ltd., (a poly-functional cresol novolac epoxy resin, epoxy equivalent weight: 215.0 g/eq.wt.) as an epoxy compound having at least two epoxy groups in its molecule, 288.3 g of acrylic acid (its molecular weight: 72.06) as a monocarboxylic acid compound having an ethylenic unsaturated group in its molecule, 492.1 g of carbitol acetate as a solvent for reaction, 4.921 g of 2,6-di-tert-butyl-p-cresol as a heat polymerization inhibitor, and 4.921 g of triphenylphosphine as a reaction catalyst; and the reactant solution was reacted at a temperature of 98° C. till the acid value of the reactant solution became not more than 0.5 mg·KOH/g. An epoxy carboxylate compound was thus obtained. Then, 169.8 g of carbitol acetate as a solvent for reaction, and 201.6 g of tetrahydrophthalic anhydride as a polybasic acid anhydride were put into the reactant solution, and the reaction system was reacted at 95° C. for 4 hours to obtain a resin solution containing 67% by weight of an alkaline aqueous solution-soluble resin (this solution was referred to as R-4). Measurement of the acid value gave 69.4 mg·KOH/g (its solid content acid value: 103.6 mg·KOH/g).

Examples 4, 5, 6 and 7, and Comparative Example 2

(R-1), (R-2), or (R-3) obtained in Example 1, Example 2, or Example 3 or (R-4) obtained in Comparative Example 1 was mixed in the formulation proportion shown in Table 1, and optionally kneaded in a three-roll mill to obtain the photosensitive resin composition of the present invention. The composition was applied on a printed board and an imide film by screen printing such that the dried film thickness became 15 to 25 μm. The applied film was dried for 30 min in a hot air drier of 80° C. Then, the dried film was irradiated, through a mask in which a circuit pattern had been depicted, with ultraviolet rays using an ultraviolet exposure apparatus (made by ORC Manufacturing Co., Ltd., model: HMW-680GW). Thereafter, the irradiated film was developed by spraying a 1% sodium carbonate aqueous solution to remove the resin of ultraviolet-unexposed parts. The developed film was washed with water and dried; then the printed board was heated in a hot air drier of 150° C. for 60 min; thereafter, the printed board for the composition of Examples 4, 5 and 6 each was heated at 300° C. for 2 hours to obtain a cured film. The obtained cured product was tested for photosensitivity, surface glossiness, board warpage, flexibility, adhesiveness, pencil hardness, solvent resistance, acid resistance, heat resistance and resistance to gold plating. The results are shown in Table 2. Testing methods and evaluating methods will be described later.

TABLE 1

|  |  | Example | | | Comparative Example |
|---|---|---|---|---|---|
|  |  | 4 and 7 | 5 | 6 | 2 |
| Resin solution | | | | | |
| R-1 |  | 46.73 | | | |
| R-2 |  |  | 46.73 | | |
| R-3 |  |  |  | 46.73 | |
| R-4 |  |  |  |  | 46.73 |
| Reactive crosslinking agent (C) | | | | | |
| DPCA-60 | *1 | 9.27 | 9.27 | 9.27 | 9.27 |
| Phtopolymerization initiator (B) | | | | | |
| Irgacure 907 | *2 | 2.92 | 2.92 | 2.92 | 2.92 |
| DETX-S | *3 | 0.58 | 0.58 | 0.58 | 0.58 |
| EPA | *4 | 0.58 | 0.58 | 0.58 | 0.58 |
| Curing component (D) | | | | | |
| NC-3000H | *5 | 17.54 | 17.54 |  | 17.54 |
| Thermal curing catalyst | | | | | |
| Melamine |  | 0.73 | 0.73 |  | 0.73 |
| Additive | | | | | |
| Barium sulfate |  | 14.61 | 14.61 |  | 14.61 |
| Phthalocyanine green |  | 0.35 | 0.35 |  | 0.35 |
| BYK-405 | *6 | 0.30 | 0.30 | 0.30 | 0.30 |
| KS-66 | *7 | 0.73 | 0.73 | 0.73 | 0.73 |
| Solvent | | | | | |
| Solvent naphtha |  | 1.03 | 1.03 | 1.03 | 1.03 |
| DPM | *8 | 4.63 | 4.63 | 4.63 | 4.63 |

Note
*1 A product made by Nippon Kayaku Co., Ltd.: ε-caprolactone-modified dipentaerythritol hexaacrylate
*2 A product made by Vantico: 2-methyl-1-[-(methylthio)phenyl]-2-morpholinopropan-1-one
*3 A product made by Nippon Kayaku Co., Ltd.: 2,4-diethylthioxanthone
*4 A product made by Nippon Kayaku Co., Ltd.: 4-dimethylaminoethyl benzoate
*5 A product made by Nippon Kayaku Co., Ltd.: bifunctional biphenol epoxy resin
*6 A product made by BYK-Chemie Gmbs: a thixotropic agent, a leveling agent
*7 A product made by Shin-Etsu Chemical Co., Ltd.: a silicone-based defoaming agent
*8 A product made by Kyowa Hakkou Kogyo Co., Ltd.: dipropylene glycol monomethyl ether (Tackiness) An absorbent cotton was rubbed on a film which had been coated on a board and dried, and the tackiness of the film was evaluated.

A . . . The absorbent cotton did not stick to the film.

B . . . Lint of the absorbent cotton stuck to the film.

(Developability) The following standard for evaluation was used.

A . . . In development, the ink was completely removed and development was performed.

B . . . In development, there was a part which had not been developed.

(Resolution) A negative pattern of 50 μm was brought into contact with a coated film after drying; and the film was irradiated with and exposed to ultraviolet rays of an accumulated light quantity of 500 mJ/cm$^2$. Then, the film was developed with a 1% sodium carbonate aqueous solution for 40 sec at a spray pressure of 2.0 kg/cm$^2$; and the transferred pattern was observed with a microscope. The following standard was used.

A . . . The pattern edge was linearly resolved.

B . . . A part of the film was exfoliated, or the pattern edge was zigzag.

(Photosensitivity) A step tablet (21 steps) (made by Eastman Kodak Co., Ltd.) was brought into contact with a coated film after drying; and the film was irradiated with and exposed to ultraviolet rays of an accumulated light quantity of 500 mJ/cm². Then, the film was developed with a 1% sodium carbonate aqueous solution for 40 sec at a spray pressure of 2.0 kg/cm²; and the number of the steps of the coated film not developed and left was confirmed.

(Surface glossiness) A coated film after drying was irradiated with and exposed to ultraviolet rays of 500 mJ/cm². Then, the film was developed with a 1% sodium carbonate aqueous solution for 60 sec at a spray pressure of 2.0 kg/cm²; and the cured film after drying was observed. The following standard was used.
A . . . No cloudiness was observed at all.
B . . . Cloudiness was slightly observed.

(Board warpage) A polyimide film was used as a board. The following standard was used.
A . . . No warpage was observed in the film.
B . . . Warpage was very slightly observed in the film.
C . . . Warpage was observed in the film.

(Flexibility) A cured film on the film was folded through 180° and observed. The following standard was used.
A . . . No cracks were observed on the film surface.
B . . . The film surface cracked.

(Adhesiveness) According to JIS K5400, a grid of 100 squares of 1 mm were scored on a test piece and subjected to a peeling test with a cellophane adhesive tape.

Peeling states of the squares were observed, and evaluated on the following standard.
A . . . No peeling was observed.
B . . . Peeling was observed.

(Pencil hardness) The evaluation was conducted according to JIS K5400.

(Solvent resistance) A test piece was immersed in isopropyl alcohol at room temperature for 30 min. The test piece was observed for whether the appearance had an abnormality, then subjected to the peeling test with a cellophane adhesive tape, and evaluated on the following standard.
A . . . The coated film appearance had no abnormality and no blister and no exfoliation were observed.
B . . . Blister and exfoliation were observed in the coated film.

(Acid resistance) A test piece was immersed in a 10% hydrochloric acid aqueous solution at room temperature for 30 min. The test piece was observed for whether the appearance had an abnormality, then subjected to the peeling test with a cellophane adhesive tape, and evaluated on the following standard.
A . . . The coated film appearance had no abnormality and no blister and no exfoliation were observed.
B . . . Blister and exfoliation were observed in the coated film.

(Heat resistance) A rosin-based flux was applied to a test piece and the test piece was immersed in a solder bath at 260° C. for 10 sec. This is let to be one cycle and three cycles thereof were repeated. The test piece was cooled to room temperature, subjected to the peeling test with a cellophane adhesive tape, and evaluated on the following standard.
A . . . The coated film appearance had no abnormality and no blister and no exfoliation were observed.
B . . . Blister and exfoliation were observed in the coated film.

(Resistance to gold plating) A test board was immersed in an acidic degreasing solution (a 20-vol % aqueous solution of Metex L-5B, made by Japan MacDermid Co., Ltd.) at 30° C. for 3 min, then washed with water, then immersed in a 14.4-wt % ammonium persulfate aqueous solution at room temperature for 3 min, and then washed with water. The board was further immersed in a 10-vol % sulfuric acid aqueous solution at room temperature for 1 min, and then washed with water. Then, the board was immersed in a catalyst solution (a 10-vol % aqueous solution of Metal Plate Activator 350, made by Meltex Inc.) at 30° C. for 7 min, washed with water, immersed in a nickel plating solution (a 20-vol % aqueous solution of Melplate Ni-865M, made by Meltex Inc., pH: 4.6) at 85° C. for 20 min to conduct nickel plating, then immersed in a 10-vol % sulfuric acid aqueous solution at room temperature for 1 min, and washed with water. Then, the test board was immersed in a gold plating solution (an aqueous solution of 15 vol % of Aurolectroless UP, made by Meltex Inc., and 3 vol % of potassium gold cyanide, pH: 6) at 95° C. for 10 min to conduct electroless gold plating, thereafter washed with water, further immersed in hot water at 60° C. for 3 min, washed with water, and dried. A cellophane adhesive tape was adhered to the obtained board to evaluate electroless gold plating, and the state of the exfoliation was observed.
A . . . No abnormality was observed at all.
b . . . Exfoliation was slightly observed.

(PCT resistance) A test board was allowed to stand in water at 121° C. at 2 atm for 96 hours, and whether the appearance had abnormality was confirmed, and then, the board was subjected to the peeling test with a cellophane adhesive tape, and evaluated on the following standard.
A . . . The coated film appearance had no abnormality, and no blister and no exfoliation were observed.
B . . . Blister and exfoliation were observed in the coated film.

(Thermal shock resistance) A test piece was subjected to a thermal history of −55° C./30 min and 125° C./30 min in 1 cycle, and after subjected to 1,000 cycles thereof, the test piece was observed with a microscope, and evaluated on the following standard.
A . . . There was no crack generated in the coated film.
B . . . There were cracks generated in the coated film.

TABLE 2

| Evaluation item | Example | | | | Comparative Example |
|---|---|---|---|---|---|
|  | 4 | 5 | 6 | 7 | 2 |
| Tackiness | A | A | A | A | A |
| Developability | A | A | A | A | A |
| Resolution | A | A | A | A | A |
| Photosensitivity | 6 | 6 | 4 | 6 | 6 |
| Surface glossiness | A | A | A | A | A |
| Board warpage | A | A | A | A | C |
| Flexibility | A | A | A | A | B |
| Adhesiveness | A | A | A | A | A |
| Pencil hardness | 8H | 8H | 8H | 8H | 8H |
| Solvent resistance | A | A | A | A | B |
| Acid resistance | A | A | A | A | A |
| Heat resistance | A | A | A | A | A |
| Resistance to gold plating | A | A | A | A | A |
| PCT resistance | A | A | A | A | A |
| Thermal shock resistance | A | A | A | A | B |

As is clear from the above-mentioned results, the active energy ray-curable alkaline aqueous solution-soluble isoimide-urethane resin (A) or (A') is a photosensitive resin composition for printed boards which has no tackiness, high sensitivity, and whose cured film is excellent in solder heat resistance, chemical resistance, resistance to gold plating, adhesiveness and the like and so flexible that if the cured product is bent, no cracks are generated on its surface and even if a board made thin is used, the board exhibits little warpage.

The invention claimed is:

1. An active energy ray-curable alkaline aqueous solution-soluble urethane resin (A), obtained by reacting a diisocyanate compound (a) with a tetrabasic acid dianhydride (b) to obtain a compound (E), reacting the compound (E) with a compound (c) having an unsaturated group and a hydroxyl group and, optionally reacting the compound (E) with a compound (d) having a hydroxyl group other than the compound (c), to obtain a compound (F), and further reacting a hydroxyl group of the compound (F) with a diisocyanate compound (e).

2. The active energy ray-curable alkaline aqueous solution-soluble urethane resin (A) according to claim 1, wherein the compound (c) having an unsaturated group and a hydroxyl group is an epoxy carboxylate compound which is a reaction product of an epoxy compound (g) having at least two epoxy groups in its molecule with a monocarboxylic acid compound (h) having an ethylenic unsaturated group in its molecule.

3. The active energy ray-curable alkaline aqueous solution-soluble urethane resin (A) according to claim 1 or 2, wherein $x<y$ is satisfied where x denotes the charging equivalent weight of the diisocyanate compound (a) and y denotes the charging equivalent weight of the tetrabasic acid dianhydride (b).

4. The active energy ray-curable alkaline aqueous solution-soluble urethane resin (A) according to claim 1 or 2, wherein $x'>y'$ is satisfied where x' denotes the charging equivalent weight of the diisocyanate compound (a) and y' denotes the charging equivalent weight of the tetrabasic acid dianhydride (b).

5. An active energy ray-curable alkaline aqueous solution-soluble urethane resin (A'), obtained by further reacting the urethane resin (A) according to claim 1 with a dibasic acid monoanhydride (j) and/or a tribasic acid monoanhydride (f).

6. The active energy ray-curable alkaline aqueous solution-soluble urethane resin according to claim 1 or 5, wherein the urethane resin has a solid content acid value of 30 mg·KOH/g to 180 mg·KOH/g.

7. A photosensitive resin composition comprising the active energy ray-curable alkaline aqueous solution-soluble urethane resin according to claim 1 or 5.

8. The photosensitive resin composition according to claim 7, further comprising a photopolymerization initiator (B), a reactive crosslinking agent (C), and as an optional component, a curing component (D).

9. A cured product of the photosensitive resin composition according to claim 8.

10. A cured product, obtained by heating the cured product of the photosensitive resin composition according to claim 9 at 200° C. to 450° C.

11. A base material having a layer of the cured product according to claim 10.

12. An article having the base material according to claim 11.

* * * * *